(12) United States Patent
Li et al.

(10) Patent No.: US 11,796,405 B2
(45) Date of Patent: Oct. 24, 2023

(54) HYBRID SENSING SYSTEM

(71) Applicant: New Degree Technology, LLC, Baltimore, MD (US)

(72) Inventors: Hao Li, Chandler, AZ (US); Zhiyun Chen, Baltimore, MD (US)

(73) Assignee: NEW DEGREE TECHNOLOGY, LLC, Baltimore, MD (US)

( * ) Notice: Subject to any disclaimer, the term of this patent is extended or adjusted under 35 U.S.C. 154(b) by 167 days.

(21) Appl. No.: 17/205,860

(22) Filed: Mar. 18, 2021

(65) Prior Publication Data

US 2021/0293633 A1 Sep. 23, 2021

Related U.S. Application Data

(60) Provisional application No. 62/992,000, filed on Mar. 19, 2020, provisional application No. 63/064,086, filed on Aug. 11, 2020.

(51) Int. Cl.
*G01L 1/22* (2006.01)
*H01L 29/8605* (2006.01)
*H01L 49/02* (2006.01)
*G01L 1/14* (2006.01)
*G01L 1/18* (2006.01)
*G06F 3/041* (2006.01)

(52) U.S. Cl.
CPC ............ *G01L 1/2293* (2013.01); *G01L 1/148* (2013.01); *G01L 1/2262* (2013.01); *G01L 1/2281* (2013.01); *H01L 28/20* (2013.01); *H01L 29/8605* (2013.01); *G01L 1/18* (2013.01); *G06F 3/041* (2013.01); *G06F 2203/04105* (2013.01)

(58) Field of Classification Search
CPC ..... G01L 1/2293; G01L 1/2262; H01L 28/20; H01L 29/8605
See application file for complete search history.

(56) References Cited

U.S. PATENT DOCUMENTS

| | | | |
|---|---|---|---|
| 5,525,549 A | 6/1996 | Fukada et al. | |
| 7,081,668 B2* | 7/2006 | Briar | H01L 24/97 |
| | | | 257/E23.092 |
| 10,012,553 B2* | 7/2018 | Su | G01M 5/0083 |
| 10,139,294 B2* | 11/2018 | Vosgueritchian | G01L 1/22 |
| 11,131,590 B2* | 9/2021 | Inamori | G01L 1/2287 |
| 2004/0084688 A1 | 5/2004 | Briar | |
| 2013/0204157 A1 | 8/2013 | Clark et al. | |

(Continued)

OTHER PUBLICATIONS

International Search Report and Written Opinion issued in PCT Application No. PCT/US21/22974 dated Jun. 8, 2021 (16 pages).

*Primary Examiner* — Freddie Kirkland, III
(74) *Attorney, Agent, or Firm* — NIXON & VANDERHYE, P.C.

(57) ABSTRACT

A hybrid strain sensing system and the method of making such a system provides a thin semiconductor film with strain sensors and signal processing circuits integrated deposited thereon. The semiconductor film may be further processed and then mounted onto a substrate to be used for strain, force, or other related measurements. The system combines the high sensitivity of a semiconductor strain gauge with the high level of integration of semiconductor integrated circuits (IC)s. Both are highly desirable features for applications where miniaturization and/or flexibility are important requirements.

19 Claims, 5 Drawing Sheets

(56) References Cited

U.S. PATENT DOCUMENTS

| | | |
|---|---|---|
| 2017/0191884 A1 | 7/2017 | Vosgueritchian et al. |
| 2018/0045588 A1 | 2/2018 | Su et al. |
| 2018/0217016 A1 | 8/2018 | Inamori et al. |
| 2018/0299335 A1* | 10/2018 | Wong ................. G01B 7/18 |
| 2019/0383677 A1* | 12/2019 | Okulan .............. H01L 41/0472 |

* cited by examiner

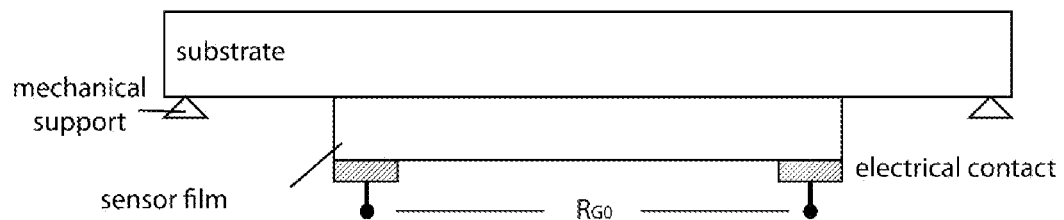
FIG. 1a
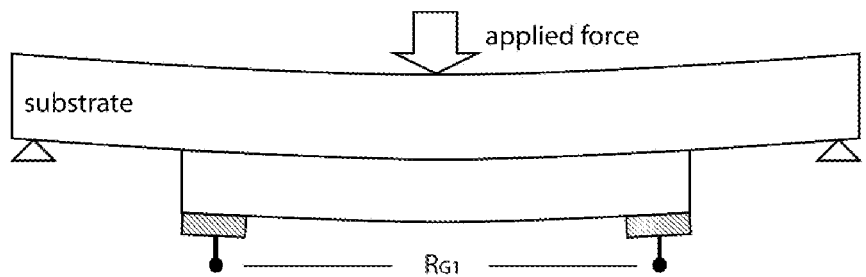
FIG. 1b
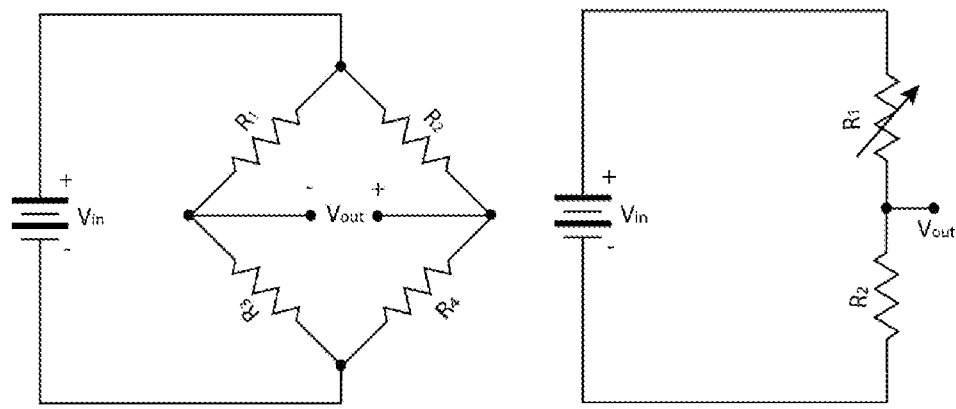
FIG. 1c
FIG. 1d

HYBRID SENSING SYSTEM

CROSS REFERENCE TO RELATED APPLICATIONS

This application claims the benefit of priority of U.S. Provisional Application No. 62/992,000, filed Mar. 19, 2020 and U.S. Provisional Application No. 63/064,086 filed Aug. 11, 2020. Each of these applications are incorporated herein by reference.

FIELD

The technology herein relates to a hybrid strain sensing system, and the method of making such a system, that incorporates at least one semiconductor strain sensing resistor, optionally together with a signal processing circuit, onto a substrate; and more particularly to a system where at least one silicon strain sensing resistor, optionally together with a signal processing circuit, is disposed onto a substrate to provide both high sensitivity and flexibility, for a variety of applications.

The field of use for such a strain sensing system includes but is not limited to strain sensing, or force sensing, or touch sensing, or tactile sensing, in any human machine interface, or machine-machine interactions, for smart phones, tablets, personal computers, touch screens, virtual reality (VR) systems, gaming systems, consumer electronics, vehicles, scientific instruments, toys, remote controls, industrial machinery, bio-medical sensors to monitor heart rate, blood pressure, and the movements and acceleration of skins, muscles, bones, joints and other body parts; robotic sensors to measure touch, local pressure, local tension, movements and acceleration of any parts of the robots; vibration sensors for buildings, bridges and any other man-made structures; sensors to monitor strain, pressure, movement, acceleration of any parts of vehicles that may be used in land, air, water, or space; movement, acceleration, and strain sensors that can be incorporated into smart fabrics; and any other applications where local static or dynamic deformation, displacement, or strain need to be measured.

STATEMENT REGARDING FEDERALLY SPONSORED RESEARCH OR DEVELOPMENT

Not applicable.

BACKGROUND ON PIEZO-RESISTIVE STRAIN SENSORS

A major type of strain sensors is based on piezo-resistive strain gauge or its variations. When a piezo-resistive material is used in a strain gauge, the conductivity, or resistivity, changes when the material is under stress. In one common form of such a strain gauge, a thin strip of the piezo-resistive material is deposited, or attached, or bonded, onto a substrate to form a variable resistor. Any deformation of the substrate, as shown in FIG. 1$b$, will induce a change of resistance in the variable resistor, R1, and by measuring the change of resistance, for example, using a Wheatstone bridge structure shown in FIG. 1$c$, the local strain, or applied force, may be calculated. The deformation of the substrate may also be measured using a half bridge, as shown in FIG. 1$d$, where R1 is a variable resistor.

The ratio of the resistance change to the local mechanical strain is defined as a Gauge Factor (GF), which can be expressed as:

$$GF = \frac{\frac{\Delta R}{R}}{\epsilon} = \frac{\frac{\Delta \rho}{\rho}}{\epsilon} + 1 + 2\upsilon \quad \text{Eq. 1}$$

where $\epsilon$ represents the mechanical strain; R, $\Delta R$, $\rho$, $\Delta \rho$ represent a resistance, a change in resistance, resistivity, and a change in resistivity respectively; and $\upsilon$ is a Poisson's Ratio, an intrinsic material property defined as the ratio between a transverse strain ($e_t$) and a longitudinal strain ($e_l$) in the elastic loading direction. For an isotropic, elastic, and homogeneous material, $-1 \leq \upsilon \leq 0.5$. Material with $\upsilon=0.5$ represents an incompressible material, i.e., the volume of the material does not change under mechanical strain.

It must be noted that such a piezo-resistive strain sensor does not require a piezo-resistive material to operate. In the present disclosure, a piezo-resistive material is defined as having a substantial change in resistivity when a mechanical strain is present. Although almost all materials exhibit a certain degree of piezo-resistivity, for many the effect is too small to be useful for any practical purposes and can be regarded as non-piezo-resistive. Even for a non-piezo-resistive material, i.e. $\Delta \rho = 0$, it is obvious from Eq. 1 that the Gauge Factor is still non-zero as the resistance still changes due to geometric change of the resistor under stress, given that the Poisson's Ratio of the constituent material does not equal to 0.5. In another word, piezo-resistive effect can still be observed using a non-piezo-resistive material. This is essentially the operating mechanism of metallic wire and foil strain gauges where a metal is used as the material to form the resistor. For resistive force sensor with non-piezo-resistive material, however, the theoretical upper limit of the Gauge Factor is approximately 2 and this severely limits their usefulness in many applications.

In a piezo-resistive material, where the resistivity changes significantly under a mechanical strain, the sensitivity of the strain gauge can be increased significantly. One example is nanocomposite materials with semi-conductive or conductive fillers dispersed in polymeric binders, such as the ones developed by New Degree Technology (U.S. Pat. No. 10,379,654, Li et al. entitled "A NANOCOMPOSITE FORCE SENSING MATERIAL", incorporated herein by reference). These materials demonstrate large change of resistivity even at very low strain level, and their GF is more than 4 times higher than that of metal strain gauges. In addition, because these nanocomposite materials can be processed similarly to a polymer, they can be solution processed near room temperature, can be printed and patterned using mature film forming and printing techniques, they are much more compatible with consumer electronic industry where high sensitivity, compatibility with flexible and plastic substrates, compatibility with volume production, flexibility in design and form factors, accuracy of placement, and low cost are important.

However, as the state-of-the-art mobile devices are becoming more and more complex, as the strain sensors are being adopted to more and more challenging applications, such as medical or robotic devices, there is an ever-increasing demand for higher sensitivity. In many industrial applications using low GF strain gauges, a mechanical structure called a load cell is often employed to focus and amplify the strain signal mechanically. For applications with very limited available space, particularly for mobile devices, medical devices or robotic applications, it is very difficult or cost prohibitive to incorporate a bulky load cell, the sensitivity ultimately relies on improving the GF of the sensing material. In these applications, even though the GF of the nanocomposite material is more than 5 times that of metal, it has become more and more difficult to provide the necessary sensitivity.

Semiconductors, such as silicon or germanium, with proper doping type and level, can have gauge factors well above 100. Although much superior in sensitivity compared to conventional strain gauges, they are often too rigid and tend to alter the mechanical properties of the objects being measured, rendering accurate measurement of the strain difficult. The common mitigation approach for silicon-based strain gauges is to reduce the thickness of the sensor to 50 micrometer or less, more preferably 30 micrometer or less, more preferably 10 micrometer or less. At this thickness, the semiconductor substrate becomes quite flexible and can easily conform to the surface being measured. Traditionally, the manufacturing process for thin silicon strain gauges is complex and the cost is high, mostly used in applications where high sensitivity is a paramount requirement. And micro-electromechanical systems (MEMS) were designed so that only the areas where the strain sensors are located are thinned to provide high sensitivity. Also, signal processing circuits must be built separately and then bonded to the MEMS to form an integrated system. With the rapid development of wafer level thinning and transferring technology, the processing cost of semiconductor strain gauges, especially silicon strain gauges, on the wafer levels, has been reduced dramatically in recent years. And an entire wafer can be thinned to the desired thickness without complex MEMS processing, paving the way for the economic integration of thin semiconductor strain gauge directly with common substrates for consumer electronics, such as printed circuit boards (PCBs) and/or flexible printed circuits (FPC), to be used in demanding applications.

In addition, because of the high technological maturity of building complex electrical circuits and systems on semiconductor, especially silicon, wafers, such an approach provides a platform that can integrate more and more functionality and intelligence into the strain sensing system with minimal change to the mechanical structure. This is particularly appealing to applications where available space for sensors is very limited due to miniaturization such as in smartphones or medical devices.

SUMMARY

The present specification discloses in one non-limiting embodiment a hybrid strain sensing system, and a method of making a hybrid strain sensing system, comprising at least one semiconductor strain sensing resistor, a signal processing circuit, and a substrate. Said strain sensing system fully utilizes the high sensitivity of the semiconductor strain gauges while the integration with signal processing circuit provides complex functionality. Such a highly sensitive, smart, and versatile system may be used in a broad array of applications where local strain or strain change; force or force change; pressure or pressure change; displacement, deformation, bending, or flexing, need to be measured.

BRIEF DESCRIPTION OF THE DRAWINGS

These and other features and advantages will be better and more completely understood by referring to the following detailed description of presently preferred illustrative non-limiting embodiments in conjunction with the drawings, of which:

FIG. 1a shows an exemplary illustrative strain sensing film deposited on a substrate to form a variable resistor. Electrical contacts are made to measure the resistance of $R_{G0}$. The two mechanical supports are shown for the convenience of demonstration. Any other designs of the supporting structure may be used as long as the structure can convert the applied force to a local strain predictably and repeatably.

FIG. 1b shows an exemplary illustrative strain sensing film deposited on a substrate under an applied force and the resistance of the structure now changes to $R_{G1}$.

FIG. 1c shows an exemplary Wheatstone bridge where one arm of the bridge, $R_1$, is replaced by a piezo-resistive resistor. $R_2$, $R_3$, $R_4$ are reference resistors and the change of the resistance of $R_1$ can be calculated from $R_1$, $R_2$, $R_3$, $R_4$, $V_{in}$, and $V_{out}$, and hence the strain and force applied to the strain sensing film can be calculated.

FIG. 1d shows an exemplary half bridge where one resistor, $R_1$, is a piezo-resistive resistor while $R_2$ is a reference resistor. The change of the resistance of $R_1$ can be calculated from $R_1$, $R_2$, $V_{in}$, and $V_{out}$, and hence the strain and force applied to the strain sensing film can be calculated.

DETAILED DESCRIPTION OF PRESENTLY PREFERRED EXAMPLE ILLUSTRATIVE NON-LIMITING EMBODIMENTS

Figure 3A:
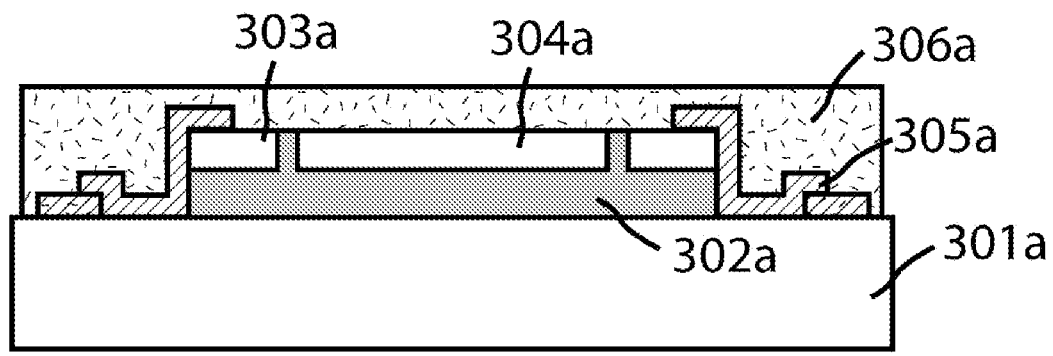
FIG. 3a depicts the exemplary illustrative first embodiment of a hybrid strain sensing system.

The first exemplary illustrative non-limiting embodiment of a hybrid strain sensing system, shown in FIG. 3a, comprising a substrate (301a), a semiconductor film (302a) deposited on top of said substrate, said semiconductor film comprising an integrated circuit (303a) and at least one strain sensor (304a); said integrated circuit and at least one strain sensor are electrically connected, at least one electrical contact (305a) deposited on top of the semiconductor film connecting to said substrate electrically, and optionally an overcoat (306a). In one example embodiment, the entire structure shown in The structure shown in FIG. 3a may be referred to as an "integrated circuit chip" and may be encapsulated in a standard integrated circuit chip package including leads, contacts, etc. The system combines the high sensitivity of a semiconductor strain gauge with the high level of integration of semiconductor integrated circuits (IC)s. Both are highly desirable features for applications where miniaturization and/or flexibility are important requirements.

Figure 3B:
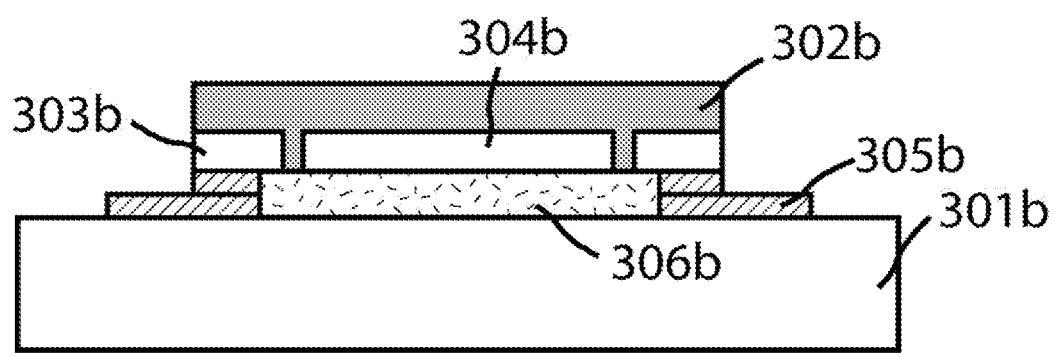
FIG. 3b depicts the exemplary illustrative second embodiment of a hybrid strain sensing system.

The second exemplary illustrative non-limiting embodiment of a hybrid strain sensing system, shown in FIG. 3b, comprising a substrate (301b), a semiconductor film (302b) deposited on top of said substrate, said semiconductor film comprising an integrated circuit (303b) and at least one strain sensor (304b); said integrated circuit and at least one strain sensor are electrically connected, at least one electrical contact (305b) disposed in between said semiconductor film and said substrate providing electrical connection, and optionally an adhesive (306b) filling the void in between said semiconductor and said substrate. The structure shown in FIG. 3b may be referred to as an "integrated circuit chip" and may be encapsulated in a standard integrated circuit chip package including leads, contacts, etc. The system combines the high sensitivity of a semiconductor strain gauge with the high level of integration of semiconductor integrated circuits (IC)s. Both are highly desirable features for applications where miniaturization and/or flexibility are important requirements.

The substrate 301b in the presently disclosed first and second embodiments of a hybrid strain sensing system may comprise a commonly used substrate for electrical circuits, such as a printed circuit board, a flexible printed circuit (FPC) board, a fiberglass board, etc. It may comprise a commonly used plastic substrate for printable electronics such as a polyimide (PI) sheet (a polymer of imide monomers belonging to the class of high performance plastics), a polyethylene terephthalate (PET) sheet, a polyurethane (PU) sheet, a polycarbonate (PC) sheet, an epoxy sheet, or a thermoplastic polyurethane (TPU) sheet, etc. It may comprise a thin glass sheet, a thin metal sheet, a sheet of paper, a thin composite sheet, a thin wood sheet, a thin ceramic sheet, etc.

Said substrate 301b in the presently disclosed first and second embodiments of a hybrid strain sensing system may comprise other electrical connections or circuits.

Said semiconductor film 302a, 302b in the presently disclosed first and second embodiments of a hybrid strain sensing system may comprise germanium, silicon, silicon carbide, gallium nitride, gallium arsenide, zinc oxide, zinc selenide, zinc sulfide, etc. Said semiconductor film may comprise a single crystal of any orientation, a polycrystal, or an amorphous solid.

The semiconductor film 302a, 302b in the presently disclosed first and second embodiments of a hybrid strain sensing system may have a maximum thickness of less than 50 μm, optionally less than 30 μm, optionally less than 25 μm, optionally less than 20 μm, optionally less than 10 μm, optionally less than 5 μm, optionally less than 1 μm. The thinner the film, the more flexible and sensitive the semiconductor strain sensor may be. However, thinner film may require more complex processing, resulting in lower production yield, and/or lower reliability. An optimal thickness range may exist for each specific system design and manufacturing process.

The semiconductor film 302a, 302b in the presently disclosed first and second embodiments of a hybrid strain sensing system may have a maximum width of less than 2 mm, optionally less than 1 mm, optionally less than 0.5 mm, optionally less than 0.3 mm, optionally less than 0.2 mm, optionally less than 0.1 mm. The narrower the film, the more flexible and sensitive the semiconductor strain sensor may be. However, narrower film may require more complex processing, resulting in lower production yield, and/or lower reliability. An optimal width range may exist for each specific system design and manufacturing process.

The semiconductor film 302a, 302b in the presently disclosed first and second embodiments of a hybrid strain sensing system may have a maximum length less than 10 mm, optionally less than 5 mm, optionally less than 1 mm, optionally less than 0.5 mm, optionally less than 0.3 mm, optionally less than 0.2 mm, optionally less than 0.1 mm. The longer the film, the more sensitive the semiconductor strain sensor may be. However, thinner film may require more complex processing, resulting in lower production yield, and/or lower reliability. An optimal length range may exist for each specific system design and manufacturing process.

The at least one strain sensor in the presently disclosed first and second embodiments of a hybrid strain sensing system may comprise at least one strain sensing resistor comprising an area of doped silicon, or an area of doped polysilicon, or an area of doped amorphous silicon. The doping may be achieved by ion-implantation, diffusion, or any other common doping process. The doping may be n-type, and the dopant may comprise phosphorous, arsenic, antimony, bismuth, lithium, or any combination thereof. The doping may be p-type, and the dopant may comprise boron, aluminum, gallium, indium, or any combination thereof. The doping may or may not be homogeneous throughout the doped volume. The doping level may be greater than $10^{15}$ cm$^{-3}$, greater than $10^{16}$ cm$^{-3}$, greater than $10^{17}$ cm$^{-3}$, greater than $10^{18}$ cm$^{-3}$, greater than $10^{19}$ cm$^{-3}$. In the case of single crystalline silicon, the lower the doping level of the stain senor, the higher the sensitivity may be. However, at lower doping level the sensitivity may be more dependent on the temperature, and an optimal doping level may exist for each specific system design and application.

The at least one strain sensor in the presently disclosed first and second embodiments of a hybrid strain sensing system may comprise at least one strain sensing resistor comprising a biased metal-oxide-semiconductor field-effect transistor (MOSFET), more specifically, the strain sensor comprising a MOSFET with a DC voltage applied between the gate and the source electrodes of the MOSFET.

The at least one strain sensor in the presently disclosed first and second embodiments of a hybrid strain sensing system may comprise at least one strain sensing resistor, said strain sensing resistor may have a gauge factor higher than 10, higher than 30, optionally higher than 50, optionally higher than 100.

When an external stress is applied, the at least one strain sensor in the presently disclosed first and second embodiments may produce an electrical signal. Said electrical signal may be a change in resistance, a change in electrical current, a change in electrical voltage, a change in electrical charge, or a change in resonance frequency, i.e. a resistance and/or inductance (e.g., capacitance) change causing a change of an RC time constant of an RC network used to set or control a resonant frequency such as in an oscillator.

The at least one strain sensor in the presently disclosed first and second embodiments of a hybrid strain sensing system may comprise more than one resistor, with one resistor placed in a region with a different strain level from at least one other resistor during strain sensing.

The at least one strain sensor in the presently disclosed first and second embodiments of a hybrid strain sensing system may comprise more than one resistor, with one resistor having a different GF to or with respect to at least one other resistor.

The at least one strain sensor in the presently disclosed first and second embodiments of a hybrid strain sensing system may comprise more than one resistor, with one resistor placed in a different orientation to or with respect to at least one other resistor. During strain sensing, the two orientations experience different strains, or intrinsically produce different electric signals in the two resistors due to the anisotropic property of the semiconductor material, or both. Note that in the present disclosure, "orientation" of a resistor refers to the direction of electrical current flowing through the resistor, not the geometric shape or rotational position of the resistor.

The at least one strain sensor in the presently disclosed first and second embodiments of a hybrid strain sensing system may comprise two resistors forming a half Wheatstone bridge, and the strain level at one resistor may be different from the strain level of the other resistor during strain sensing.

The at least one strain sensor in the presently disclosed first and second embodiments of a hybrid strain sensing system may comprise two resistors forming a half Wheatstone bridge, the GF of one resistor may be different from the GF of the other resistor.

The at least one strain sensor in the presently disclosed first and second embodiments of a hybrid strain sensing system may comprise two resistors forming a half Wheatstone bridge, the direction of electrical current in at least one resistor may be perpendicular to the direction of electrical current of the other resistor.

The at least one strain sensor in the presently disclosed first and second embodiments of a hybrid strain sensing system may comprise four resistors forming a Wheatstone bridge, the strain level at one resistor may be different to the strain level of at least one other resistor during strain sensing.

The at least one strain sensor in the presently disclosed first and second embodiments of a hybrid strain sensing system may comprise four resistors forming a Wheatstone bridge, the GF of one resistor may be different to the GF of at least one other resistor.

The at least one strain sensor in the presently disclosed first and second embodiments of a hybrid strain sensing system may comprise four resistors forming a Wheatstone bridge, the direction of electrical current in at least one resistor may be perpendicular to the direction of the electrical current of at least another resistor.

Figure 2A:
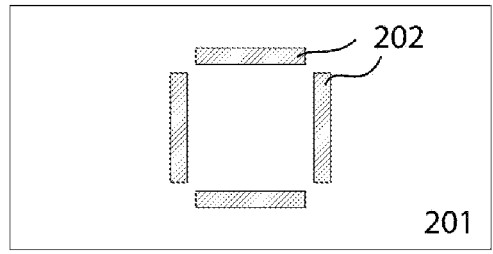
FIGS. 2a, 2b, 2c, 2d, 2e, 2f, 2g, 2h depict eight exemplary illustrative arrangements of resistors on a strain sensing film. The rectangle shape of the resistors is not related to the actual shape of the resistors but an indication of the electrical current flowing through the resistors. The electrical current flows parallel to the long side of the rectangle.
Figure 2B:
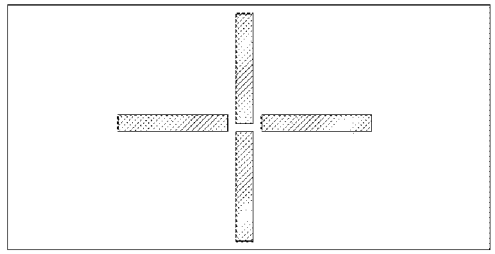

At least one strain sensor in the presently disclosed first and second embodiments of a hybrid strain sensing system may comprise more than one resistor forming patterns such as those shown in FIG. 2a. The outer rectangle, 201, represents the semiconductor film the resistors are built on (it is not drawn to the proportion of the actual semiconductor film). The shaded rectangles, 202, represent the resistors deposited on the semiconductor film. The rectangular shape of the resistors shown in FIGS. 2a, 2h does not represent the actual shape of the resistors, it is used to represent the direction of electrical current. The current flows parallel to the long side of the rectangle. The actual resistors may comprise different aspect ratios, they may even comprise a combination of sections, each section having its own aspect ratio. Also, the location of each resistor is also illustrative, and may not be its actual position. All configurations in FIGS. 2a-2h only illustrate the relationship of the orientations of the resistors, not their locations. Therefore for example, FIG. 2a and FIG. 2b may represent the same configuration as they both comprise four resistors, each resistor is perpendicular to two other resistors, and each resistor is parallel to at least one side of 201.

Figure 2C:
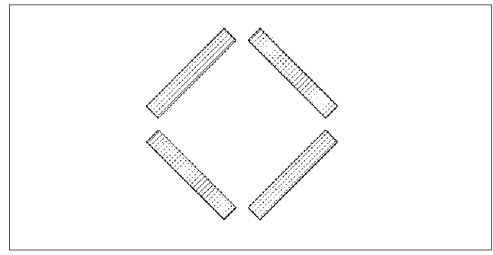

FIG. 2c comprises four resistors, each resistor being perpendicular to two other resistors, each resistor being angled 45 degree to at least one side of 201.

Figure 2D:
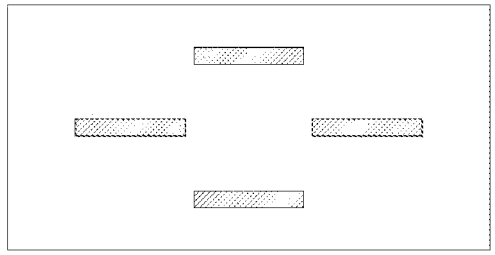

FIG. 2d comprises four resistors that are all parallel to each other.

Figure 2E:
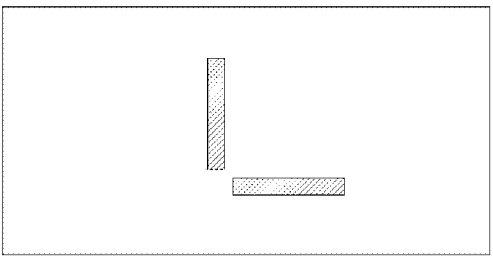

FIG. 2e comprises two resistors that are perpendicular to each other.

Figure 2F:
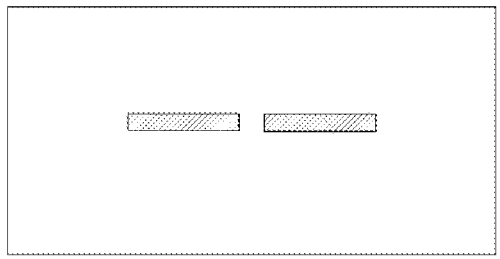

FIG. 2f comprises two resistors that are parallel to each other.

Figure 2G:
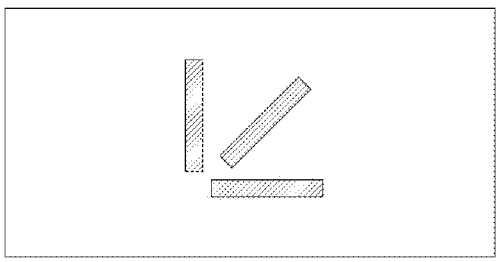

FIG. 2g comprises three resistors, each resistor is angled 45 degree to at least one other resistor.

Figure 2H:
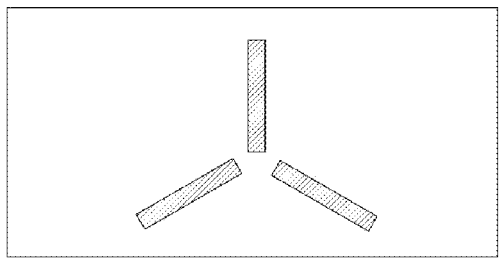

FIG. 2h comprises three resistors, each resistor is angled 60 degree, or 120 degree, to at least one other resistor.

The integrated circuit in the presently disclosed first and second embodiments of a hybrid strain sensing system may further comprise, consist of or consist essentially of a power supplier, an amplifying circuit, an analog to digital converter (ADC), an digital to analog converter (DAC), a multiplexer (MUX), a micro-controller (MCU), or any other common signal processing and control circuits. The integrated circuit may also further comprise a temperature sensor that provides the local temperature near the strain sensor.

The integrated circuit in the presently disclosed first and second embodiments of a hybrid strain sensing system may operate in a DC mode. It may also operate in an AC mode or a pulsed mode. It may operate in a low-power consumption sleeping mode, and upon an external trigger event, switch to a high-power consumption detection mode, and switch back to the low-power consumption mode when the trigger event has passed.

The local temperature provided by said temperature sensor in the presently disclosed first and second embodiments of a hybrid strain sensing system may be used in an algorithm to correct the temperature effect of the strain sensor. The algorithm may be based on theoretical calculation, previously measured data under controlled conditions, or the combination of the two.

The semiconductor film 302a, 302b in the presently disclosed first and second embodiments of a hybrid strain sensing system may be attached to said substrate by an adhesive, such as a commercial die attach film (DAF), said overcoat, or soldering.

The at least one electrical contact 305a, 305b in the presently disclosed first embodiment of a hybrid strain sensing system may comprise conductive paste formed using common printing techniques such as screen printing, ink-jet printing, roll-to-roll printing, etc. The printing process may further be followed by a thermal annealing process to form at least one ohmic contact. It may be formed by wire-bonding or soldering.

The at least one electrical contact 305a in the presently disclosed first embodiment of a hybrid strain sensing system may comprise gold, copper, or aluminum wire formed by commonly used wire-bonding or soldering process.

The at least one electrical contact 305b in the presently disclosed second embodiment of a hybrid strain sensing system may comprise conductive adhesive or conductive paste using common printing techniques such as screen printing, ink-jet printing, roll-to-roll printing, etc. The printing process may further be followed by a thermal annealing process to form at least one ohmic contact.

The at least one electrical contact 305b in the presently disclosed second embodiment of a hybrid strain sensing system may comprise solder bumps formed by commonly used flip-chip process.

The overcoat 306a in the presently disclosed first embodiment of a hybrid strain sensing system may provide electrical insulation, protection against dust, water, humidity, or adhesion of the semiconductor film to said substrate.

The adhesive 306b in the presently disclosed second embodiment of a hybrid strain sensing system may provide electrical insulation, protection against dust, water, humidity, or adhesion of the semiconductor film to said substrate.

The presently disclosed first and second embodiments of a hybrid strain sensing system may be attached to a working surface to measure the strain of said surface. Said attaching may comprise attaching using a mechanical structure, gluing, or soldering.

Figure 4:
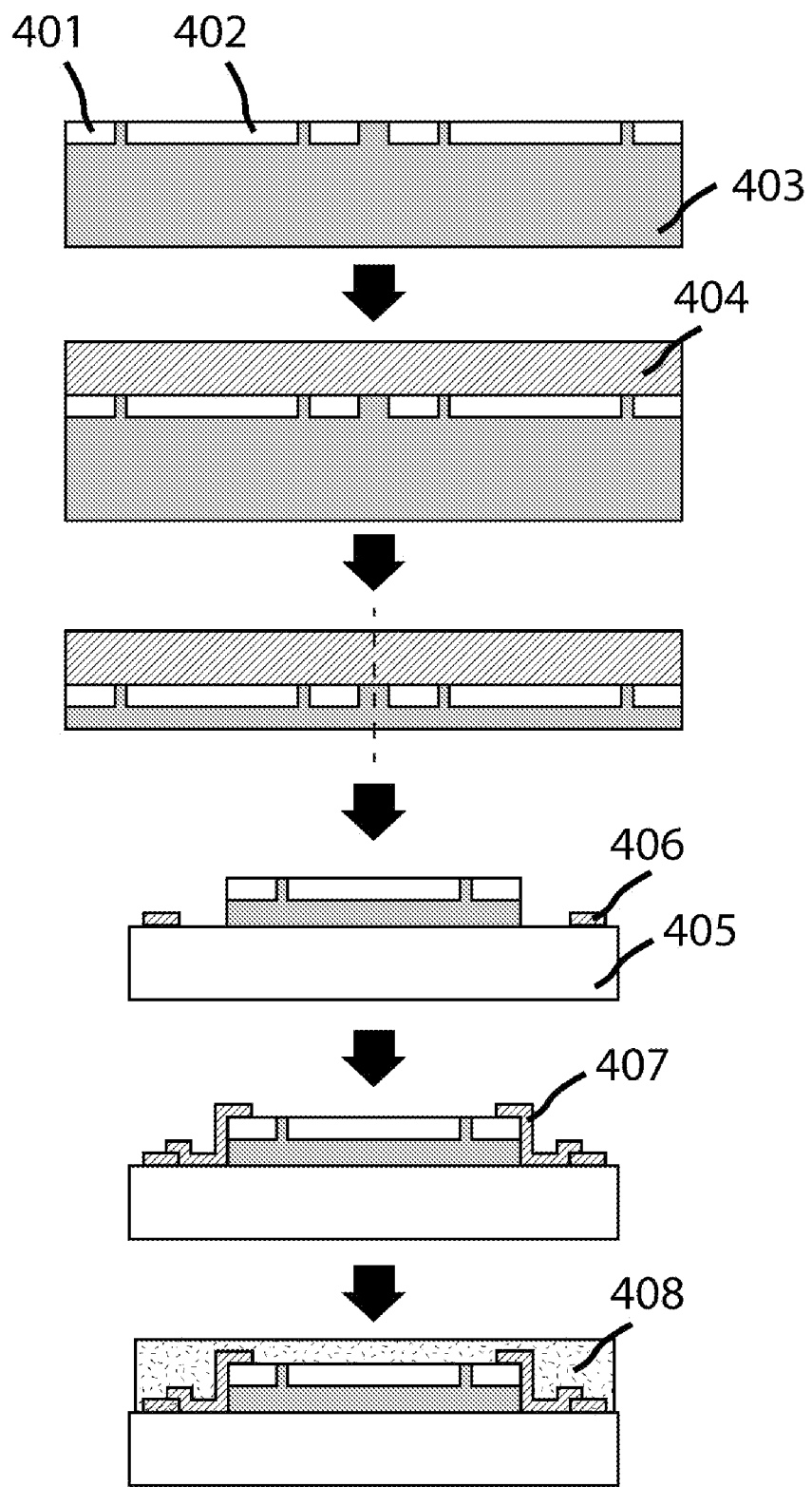
FIG. 4 depicts the exemplary illustrative first embodiment of a method of making a hybrid strain sensing system.

The first exemplary illustrative non-limiting embodiment of a method of making a hybrid strain sensing system, shown in FIG. 4a, may comprise building an integrated circuit (401) and at least one strain sensing resistor (402) on the topside of a semiconductor wafer (403); at least partially protecting the topside surface of said semiconductor wafer with at least one protective layer (404), thinning the backside of said semiconductor wafer to reduce thickness, dicing the semiconductor wafer into at least one die, attaching the backside surface of said die to a substrate (405), said substrate may comprise previously deposited electrical connections (406), providing at least one electrical contact (407) between said integrated circuit on said die to said previously deposited electrical connections on said substrate, depositing overcoat (408) covering at least part of said die.

Figure 5:
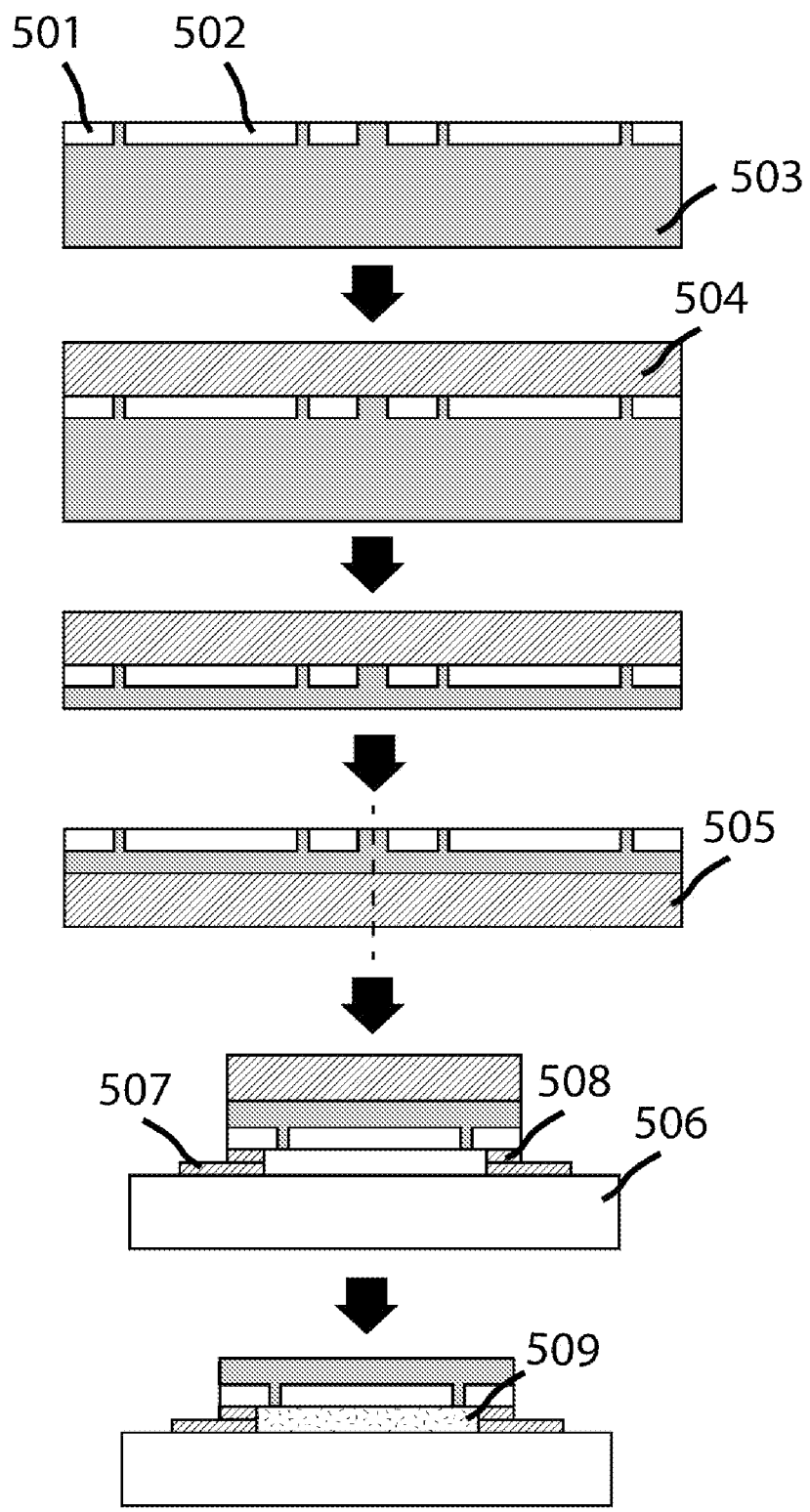
FIG. 5 depicts the exemplary illustrative second embodiment of a method of making a hybrid strain sensing system.

The second exemplary illustrative non-limiting embodiment of a method of making a hybrid strain sensing system, shown in FIG. 5, may comprise building an integrated circuit (501) and at least one strain sensing resistor (502) on the topside of a semiconductor wafer (503); at least partially protecting the topside surface of said semiconductor wafer with a first protective layer (504), thinning the backside of said semiconductor wafer to a lower thickness, providing the backside surface of said semiconductor wafer with a second protective layer (505), dicing the semiconductor wafer into at least one die, attaching the topside surface of said die to a substrate (506) with previously deposited electrical connections (507), providing at least one electrical contact (508) between said integrated circuit on said die to the previously deposited electrical connections on said substrate, providing underfill (509) in the void between said semiconductor die and said substrate.

Said substrate in the presently disclosed first and second embodiments of a method of making a hybrid strain sensing system may comprise a commonly used substrate for electrical circuits, such as a printed circuit board, a flexible printed circuit (FPC) board, a fiberglass board, etc. It may comprise a commonly used plastic substrate for printable electronics such as a polyimide (PI) sheet, a polyethylene terephthalate (PET) sheet, a polyurethane (PU) sheet, a polycarbonate (PC) sheet, an epoxy sheet, or a thermoplastic polyurethane (TPU) sheet, etc. It may comprise a thin glass sheet, a thin metal sheet, a sheet of paper, a thin composite sheet, a thin wood sheet, a thin ceramic sheet, etc.

Said substrate in the presently disclosed first and second embodiments of a method of making a hybrid strain sensing system may comprise other electrical connections or circuits.

Said semiconductor wafer in the presently disclosed first and second embodiments of a method of making a hybrid strain sensing system may comprise germanium, silicon, silicon carbide, gallium nitride, gallium arsenide, zinc oxide, zinc selenide, zinc sulfide, etc. Said semiconductor film may comprise a single crystal of any orientation, a polycrystal, or an amorphous solid.

Said thinning in the presently disclosed first and second embodiments of a method of making a hybrid strain sensing system may comprise a common wafer thinning process, mechanical polishing, chemical wet etching, chemical mechanical polishing (CMP), reactive ion etch (RIE), and any combination thereof.

Said dicing in the presently disclosed first and second embodiments of a method of making a hybrid strain sensing system may comprise sawing, blade dicing, laser cutting, or any common method of separation semiconductor wafer into individual dies.

Said dicing in the presently disclosed first and second embodiments of a method of making a hybrid strain sensing system may comprise a pre-dicing step, i.e. dice before grinding (DBG), before said thinning process to control the final thickness of the die, said pre-dicing may comprise dicing street with a depth less than the original thickness of said semiconductor wafer.

Said die in the presently disclosed first and second embodiments of a method of making a hybrid strain sensing system may have a maximum thickness of less than 50 μm, optionally less than 30 μm, optionally less than 25 μm, optionally less than 20 μm, optionally less than 10 μm, optionally less than 5 μm, optionally less than 1 μm.

Said die in the presently disclosed first and second embodiments of a method of making a hybrid strain sensing system may have a maximum width of less than 2 mm, optionally less than 1 mm, optionally less than 0.5 mm, optionally less than 0.3 mm, optionally less than 0.2 mm, optionally less than 0.1 mm.

Said die in the presently disclosed first and second embodiments of a method of making a hybrid strain sensing system may have a maximum length less than 10 mm, optionally less than 5 mm, optionally less than 1 mm, optionally less than 0.5 mm, optionally less than 0.3 mm, optionally less than 0.2 mm, optionally less than 0.1 mm.

The at least one strain sensor in the presently disclosed first and second embodiments of a method of making a hybrid strain sensing system may comprise at least one strain sensing resistor comprising an area of doped silicon, or an area of doped polysilicon, or an area of doped amorphous silicon. The doping may be achieved by ion-implantation, diffusion, or any other common doping process. The doping may be n-type, the dopant may comprise phosphorous, arsenic, antimony, bismuth, lithium, or any combination thereof. The doping may be p-type, the dopant may comprise boron, aluminum, gallium, indium, or any combination thereof. The doping may or may not be homogeneous throughout the doped volume. The doping level may be greater than $10^{15}$ cm$^{-3}$, greater than $10^{16}$ cm$^{-3}$, greater than $10^{17}$ cm$^{-3}$, greater than $10^{18}$ cm$^{-3}$, greater than $10^{19}$ cm$^{-3}$. In the case of single crystalline silicon, the lower the doping level of the stain senor, the higher the sensitivity may be. However, at lower doping level the sensitivity may be more dependent on the temperature, an optimal doping level may exist for each specific system design and application.

The at least one strain sensor in the presently disclosed first and second embodiments of a method of making a hybrid strain sensing system may comprise at least one strain sensing resistor comprising a biased MOSFET, more specifically, the strain sensor comprising a MOSFET with a DC voltage applied between the gate and the source electrodes.

The at least one strain sensor in the presently disclosed first and second embodiments of a method of making a hybrid strain sensing system may comprise at least one strain sensing resistor, said strain sensing resistor may have a gauge factor higher than 10, higher than 30, optionally higher than 50, optionally higher than 100.

The at least one strain sensor in the presently disclosed first and second embodiments of a method of making a hybrid strain sensing system may comprise more than one resistor, with one resistor placed in a region with a different strain level from at least one other resistor during strain sensing.

The at least one strain sensor in the presently disclosed first and second embodiments of a method of making a hybrid strain sensing system may comprise more than one resistor, with one resistor has a different GF to at least one other resistor.

The at least one strain sensor in the presently disclosed first and second embodiments of a method of making a hybrid strain sensing system may comprise more than one resistor, with one resistor placed in a different orientation to at least another resistor. During strain sensing, the two orientations experience different strain, or intrinsically produce different electric signals in the two resistors due to the anisotropic property of the semiconductor material, or both.

The at least one strain sensor in the presently disclosed first and second embodiments of a method of making a hybrid strain sensing system may comprise two resistors forming a half Wheatstone bridge, the strain level at one resistor may be different to the strain level of the other resistor during strain sensing.

The at least one strain sensor in the presently disclosed first and second embodiments of a method of making a hybrid strain sensing system may comprise two resistors forming a half Wheatstone bridge, the direction of electrical current in one resistor may be perpendicular to the direction of electrical current of the other resistor.

The at least one strain sensor in the presently disclosed first and second embodiments of a method of making a hybrid strain sensing system may comprise two resistors forming a half Wheatstone bridge, the GF of one resistor may be different to the GF of the other resistor.

The at least one strain sensor in the presently disclosed first and second embodiments of a method of making a hybrid strain sensing system may comprise four resistors forming a Wheatstone bridge, the strain level at one resistor may be different to the strain level of at least one other resistor during strain sensing.

The at least one strain sensor in the presently disclosed first and second embodiments of a method of making a hybrid strain sensing system may comprise four resistors forming a Wheatstone bridge, the direction of electrical current in at least one resistor may be perpendicular to the direction of electrical current of at least one other resistor.

The at least one strain sensor in the presently disclosed first and second embodiments of a method of making a hybrid strain sensing system may comprise four resistors forming a Wheatstone bridge, the GF of one resistor may be different to the GF of at least one other resistor.

At least one strain sensor in the presently disclosed first and second embodiments of a method of making a hybrid strain sensing system may comprise four resistors forming patterns shown in FIG. 2.

The integrated circuit in the presently disclosed first and second embodiments of a method of making a hybrid strain sensing system may comprise, consist of or consist essentially of a power supplier, an amplifying circuit, an analog to digital converter (ADC), an digital to analog converter (DAC), a multiplexer (MUX), a micro-controller (MCU), or any other common signal processing and control circuits. The integrated circuit may also comprise a temperature sensor that provides the local temperature near the strain sensor.

Said attaching in the presently disclosed first and second embodiments of a method of making a hybrid strain sensing system may further comprise providing adhesive between the die and the substrate, and a thermal curing, UV curing, annealing, or sintering process to achieve necessary adhesion and hardness of the adhesive.

The presently disclosed first and second embodiments of a method of making a hybrid strain sensing system may further comprise applying adhesive on said substrate where at least one die may be attached to said adhesive. Said applying may include dispensing, stencil printing, screen printing, roll-to-roll printing or any common application process.

The presently disclosed first embodiment of a method of making a hybrid strain sensing system may further comprise applying an adhesive layer to the backside after the thinning process, said adhesive layer may be a die attach film (DAF).

The presently disclosed first embodiment of a method of making a hybrid strain sensing system may further comprise applying an adhesive layer to the backside of at least one die after the dicing process, said adhesive layer may be a die attach film (DAF).

The presently disclosed second embodiment of a method of making a hybrid strain sensing system may further comprise applying an adhesive layer to the topside of the wafer before said attaching process, said adhesive layer may be a die attach film (DAF).

The presently disclosed second embodiment of a method of making a hybrid strain sensing system may further comprise applying an adhesive layer on the topside of at least one die after the dicing process, said adhesive layer may be a die attach film (DAF).

The at least one electrical contact in the presently disclosed first embodiment of a method of making a hybrid strain sensing system may comprise conductive paste formed using common printing techniques such as screen printing, ink-jet printing, roll-to-roll printing, etc. The printing process may further be followed by a thermal annealing process to form ohmic contact. It may be formed by wire-bonding or soldering.

The at least one electrical contact in the presently disclosed first embodiment of a method of making a hybrid strain sensing system may comprise gold, copper, or aluminum wire formed by commonly used wire-bonding or soldering process.

The at least one electrical contact in the presently disclosed second embodiment of a method of making a hybrid strain sensing system may comprise conductive adhesive or conductive paste using common printing techniques such as screen printing, ink-jet printing, roll-to-roll printing, etc. The printing process may further be followed by a thermal annealing process to form ohmic contact.

The at least one electrical contact in the presently disclosed second embodiment of a method of making a hybrid strain sensing system may comprise solder bumps formed by commonly used flip-chip process.

The said hybrid strain sensing system in the presently disclosed first and second embodiments of a method of making a hybrid strain sensing system may be attached to the working surface to measure the strain of said surface, said attaching may comprise attaching using a mechanical structure, gluing, or soldering.

An electronic system comprising any presently disclosed embodiments of a hybrid strain sensing system. Said hybrid strain sensing system may generate strain, pressure, force, touch, twist, displacement, or acceleration information upon external input and send to the electronic system for further processing; said information may be sent as an on-and-off electronic signal produced by said hybrid strain sensing system; said information may be sent as an analog electronic signal produced by said hybrid strain sensing system; said information may be sent as digital electronic signal produced by said hybrid strain sensing system.

Said electronic system may comprise a computer, a smartphone, a tablet, a laptop, a smart watch, a headphone, a smart glass, a game controller, a health monitoring system, a control panel for a vehicle, a robot, a motion capture system, a sport equipment, a toy, a Virtual Reality controller, a tactile controller or any systems where interaction through physical interaction with a finger, skin, or other body parts of a human or an animal, or an object, may be needed. Said electronic system may comprise a strain, force, pressure, displacement, deflection, acceleration, or torque measurement instrument.

All patents and publications cited herein are incorporated by reference for all purposes as if expressly set forth.

The above description is non-limiting. The scope of protection of this patent shall be defined by the claims, which are intended to cover all equivalent arrangements and variations thereof.

The invention claimed is:

1. A hybrid strain sensing system comprising:
   a substrate,
   a semiconductor film attached to and integrated directly with a surface of said substrate, said semiconductor film comprising an integrated circuit and at least one strain sensor electrically connected to the integrated circuit, said semiconductor film having a maximum thickness less than 30 μm,
   at least one electrical contact electrically connecting said semiconductor film to said substrate, and
   an overcoat at least partially covering said semiconducting film or said substrate.

2. The hybrid strain sensing system of claim 1 wherein said semiconductor film comprises germanium, silicon, silicon carbide, gallium nitride, gallium arsenide, zinc oxide, zinc selenide, or zinc sulfide.

3. The hybrid strain sensing system of claim 1 wherein said semiconductor film comprises a single crystal of any orientation, a polycrystal, or an amorphous solid.

4. The hybrid strain sensing system of claim 1 wherein the hybrid strain sensing system has a maximum thickness of less than 50 μm, optionally less than 30 μm, optionally less than 25 μm, optionally less than 20 μm, optionally less than 10 μm, optionally less than 5 μm, and optionally less than 1 μm.

5. The hybrid strain sensing system of claim 1 wherein the semiconductor film has a maximum width of less than 2 mm, optionally less than 1 mm, optionally less than 0.5 mm, optionally less than 0.3 mm, optionally less than 0.2 mm, optionally less than 0.1 mm.

6. The hybrid strain sensing system of claim 1 wherein the hybrid strain sensing system has a maximum length less than 10 mm, less than 5 mm, less than 1 mm, less than 0.5 mm, less than 0.3 mm, less than 0.2 mm, or less than 0.1 mm.

7. The hybrid strain sensing system of claim 1 further comprising at least one strain sensing resistor comprising an area of doped silicon, or an area of doped polysilicon, or an area of doped amorphous silicon, wherein a doping level is greater than $10^{15}$ cm-3, preferably greater than $10^{16}$ cm-3, preferably greater than $10^{17}$ cm-3, preferably greater than $10^{18}$ cm-3, and preferably greater than $10^{19}$ cm-3.

8. The hybrid strain sensing system of claim 1 further comprising at least one strain sensing resistor comprising a biased metal-oxide-semiconductor field-effect transistor (MOSFET) with a DC voltage applied between a gate and source electrodes of the MOSFET.

9. The hybrid strain sensing system of claim 1 wherein the strain sensor comprises at least one strain sensing resistor having a gauge factor higher than 10, higher than 30, optionally higher than 50, optionally higher than 100.

10. The hybrid strain sensing system of claim 1 wherein the strain sensor in response to application of external stress produces an electrical signal.

11. The hybrid strain sensing system of claim 1 wherein the strain sensor comprises more than one resistor, with one resistor placed in a region with a different strain level from at least one other resistor during strain sensing.

12. The hybrid strain sensing system of claim 1 wherein the strain sensor comprises more than one resistor, with one resistor having a different Gauge Factor to or with respect to at least one other resistor.

13. The hybrid strain sensing system of claim 1 wherein the at least one strain sensor comprises plural resistors, with one resistor placed in a different orientation to or with respect to at least one other resistor.

14. The hybrid strain sensing system of claim 13 wherein the plural resistors form a half Wheatstone bridge, and a strain level at one resistor is different from a strain level of another resistor during strain sensing.

15. The hybrid strain sensing system of claim 1 wherein a Gauge Factor (GF) of one resistor is different from the GF of another resistor.

16. The hybrid strain sensing system of claim 1 wherein the direction of electrical current in at least one resistor is perpendicular to the direction of electrical current of another resistor.

17. A method of making a hybrid strain sensing system comprising:
   building an integrated circuit and at least one strain sensing resistor on a surface of a semiconductor wafer;
   at least partially protecting the surface of said semiconductor wafer with at least one protective layer,
   thinning a backside surface of said semiconductor wafer to reduce thickness,
   dicing the semiconductor wafer into at least one semiconductor die,
   attaching a backside surface of said semiconductor die to a surface of a substrate,
   providing at least one electrical contact between said integrated circuit on said semiconductor die to previously deposited electrical connections on said substrate, and
   depositing overcoat covering at least part of said semiconductor die.

18. The method of claim 17 further including providing the backside surface of said semiconductor wafer with a second protective layer.

19. The method of claim 17 further comprising providing underfill in a void between said semiconductor die and said substrate.

* * * * *